(12) United States Patent
Reyes

(10) Patent No.: US 7,545,217 B1
(45) Date of Patent: Jun. 9, 2009

(54) SYSTEM AND METHOD FOR IMPROVING POWER EFFICIENCY IN GSM POWER AMPLIFIERS

(75) Inventor: Julio Reyes, Leonia, NJ (US)

(73) Assignee: Anadigics, Inc., Warren, NJ (US)

( * ) Notice: Subject to any disclaimer, the term of this patent is extended or adjusted under 35 U.S.C. 154(b) by 607 days.

(21) Appl. No.: 10/844,649

(22) Filed: May 12, 2004

(51) Int. Cl.
    *H03G 3/30* (2006.01)
(52) U.S. Cl. ..................... 330/285; 330/297
(58) Field of Classification Search ............... 330/129, 330/133, 134, 285, 297
    See application file for complete search history.

(56) References Cited

U.S. PATENT DOCUMENTS 6,885,246 B2 * 4/2005 Tsutsui et al. ............... 330/285
7,177,370 B2 * 2/2007 Zhang et al. ................ 330/297

* cited by examiner

*Primary Examiner*—Khanh V Nguyen
(74) *Attorney, Agent, or Firm*—Ward & Olivo

(57) ABSTRACT

A method and circuit system for improving power efficiency of RF power amplifiers is disclosed. A preferred embodiment comprises a power amplifier comprising: a plurality of amplifier stages, a power regulator providing an output supply voltage at an output node responsive to an adjustable power control signal, wherein the output supply voltage is applied to at least one stage of a power amplifier; and an amplifier biaser providing a bias signal corresponding to the adjustable power control signal, wherein the output supply voltage and the bias signal are independently generated as functions of the adjustable power control signal.

26 Claims, 4 Drawing Sheets

SYSTEM AND METHOD FOR IMPROVING POWER EFFICIENCY IN GSM POWER AMPLIFIERS

BACKGROUND OF THE INVENTION

1. Field of the Invention

This invention relates in general to power amplifier circuits and in particular to a method and circuit system for improving low power efficiency of RF power amplifiers.

2. Description of the Related Art

A component common to wireless devices is a radio frequency (RF) power amplifier. Power amplifiers typically receive as input a frequency or phase modulated radio frequency carrier and boost the power of the RF carrier to a level sufficient for reception by a cellular base station. Unfortunately, a simple single fixed power level is not efficient when used in a cellular network. Mobile users transmitting while traveling through multiple cells at a single fixed high power setting could overwhelm several cellular base stations resulting in underutilization of the infrastructure. In contrast, a mobile user transmitting at too low a power setting could experience unreliable short-range communication with perhaps a single cellular base station.

Power control is essential to the smooth operation of wireless communication systems where there are many users sharing the frequency spectrum. Output power for each individual user should be adjusted dynamically to maximize the system capacity and resolve the near-far multiple-access in a spread-spectrum system. Accordingly, various wireless communication standards require precise output power control over a large dynamic range. Such control reduces the likelihood of a transmitter located in one cell interfering with the reception of other transmitters in neighboring cells while ensuring that communication with the targeted base station is not impaired.

Power amplifiers (PA) should be energy efficient to prolong operation time from a single battery charge. Accordingly, many RF power amplifiers have two modes of operation corresponding to a low power (LP) and a high power (HP) mode.

Selecting and efficiently controlling output power delivered by a RF amplifier presents several challenges. For example, reducing the transmitted output power by dissipating excess power, although simple, wastes power and reduces battery life. In another aspect complicating power control strategies, the efficiency of a PA varies significantly over the output power range. The PA is typically designed to maximize efficiency at higher output power levels because current drain efficiency of the PA is most affected at a higher output power. This results in poor performance and low signal-to-noise ratios at lower power levels. The low signal-to-noise ratio is, in part, due to the presence of noise generated by the power management strategy itself. These relatively high noise levels increase the stability problem of the PA.

There are several techniques in use for modulating the output power of a RF power amplifier although none of them manage to satisfactorily overcome the above-described challenges. One technique switches the quiescent current of the PA in response to a change in the power mode (such as between HP and LP). The PA is biased with high quiescent current in HP mode to maximize its output current swing and is biased with low quiescent current in LP mode to reduce power consumption.

Load switching is another technique for improving the efficiency for multiple output power levels. In this method, the output load is adjusted according to the output power requirements.

A third technique samples the output power and adjusts the supply voltage to the power amplifier in a feedback loop to adjust the output power to a desired level. Such adjustments, known as high-level modulation, have been practiced for high power AM transmitters. Motorola® and ON® Semiconductor provide chips to help manage supply voltage for RF power amplifiers based on feedback using sampled supply voltages and output RF power. The sampling, however, often results in the generation of undesirable higher harmonic signals, which requires additional (and costly) filtering to suppress such harmonics to comply with international communication regulations. In addition, the change in gain in various amplifier stages as the supply voltage changes can generate noise and cause instability problems.

Any adjustable output power implementation for RF amplifiers should comply with a specification known as a "burst mask," which specifies the rise time, fall time, duration, and power levels associated with the adjustable power control signal. In other words, the ramp up time and ramp down time of Vramp should conform to the shape of the burst mask while the output power level corresponds to the magnitude of Vramp. For example, in GSM radiotelephones, the GSM signal further consists of eight equal time slots, each of which must conform to the burst mask specification.

U.S. Pat. No. 6,701,138 discloses a design for varying the supply voltage to control power level of a power amplifier in response to a control voltage. However, the '138 patent requires that no changes in the bias conditions for the first stage of the power amplifier be made regardless of the power level of the output signal. Moreover, for the remaining stages in the power amplifier all of the disclosed embodiments in the '138 patent require that all of the bias signals be held steady to avoid generation of noise due to changes in bias levels. Thus, the requirements for the power amplifier to respond linearly to the Vramp signal in a narrow time window with little noise generation presents significant problems in the known designs. Such requirements make designing a power amplifier suitable for efficient operation at multiple power levels a challenge.

FIG. 1 is a schematic diagram of a power amplifier capable of operating at more than one power level. Power amplifier module 160 is coupled to an adjustable voltage control signal, Vramp, at port 120 via Vapc and a regulated voltage source, Vreg, at port 180. The adjustable voltage control signal, Vramp, is coupled to op/Amp 130, which is connected to the gate of PMOS transistor 140. The source 135 of PMOS transistor 140 is coupled to battery source 110. The drain 145 of PMOS transistor 140 is connected to the power amplifier module 160 and provides power supply voltage, Vd, to power amplifier module 160. Power amplifier module 160 typically contains one or more cascaded stages. An example power amplifier module is the MMM 5062 model produced by Motorola for use in Quad-Band GSM/GPRS handheld radios.

op/Amp 130 and PMOS transistor 140 work together as a linear voltage regulator under the control of Vramp. This linear voltage regulator varies supply voltage, Vd, between about the ground voltage and approximately the battery voltage in response to the corresponding variations in Vramp. Power supply voltage, Vd, for power amplifier module 160 determines the power level for power amplifier module 160. In order to obtain linear amplification it is desirable that the bias voltage stays above a threshold voltage level.

In FIG. 1, Vapc is the power control voltage providing the bias for the cascaded RF power amplifiers in power amplifier module 160. Vapc is set by the voltage divider network formed by resistances 150 and 155 connected between Vreg and Vd.

The power control circuit shown in FIG. 1 is prone to excessive noise because changing Vd to adjust the power level of power amplifier module 160 introduces harmonics in the power amplifier output. Furthermore, the noise associated with Vreg and Vd is also introduced into power amplifier module 160. In other words, noise associated with Vreg and Vd is introduced as noise in Vapc and thereby the output of the power amplifier. The noise problem becomes more significant when operating in the low power mode because the noise tends to be a greater fraction of the total output signal.

Therefore a need exists for an adjustable RF power amplifier module resistant to noise while providing improved power efficiency especially in low power modes.

SUMMARY OF THE INVENTION

The present invention provides a system and method for providing amplifier with improved power efficiency, stability and increased resistance to noise.

A preferred embodiment of a power amplifier comprises: a plurality of amplifier stages, a power regulator, which is responsive to an adjustable power control signal, providing an output supply voltage at an output node, and an amplifier biaser providing quiescent bias conditions corresponding to the adjustable power control signal. The output supply voltage and the bias conditions are independently generated in response to the adjustable power control signal and applied to at least one stage of the power amplifier.

The power amplifier may further comprise a common biaser to provide the same bias to two or more amplifier stages. The power regulator and the amplifier biaser may be implemented in a single integrated circuit. The bias signal is preferably a linear function of the adjustable power control signal. This linear function preferably is a linear sum of a regulated voltage and the adjustable power control signal.

Another preferred embodiment includes a power amplifier comprising a power regulator and an amplifier biaser, wherein the power regulator and the amplifier biaser are independently responsive to an adjustable power control signal. Accordingly, the amplifier biaser generates a biasing signal corresponding to an output supply voltage provided by the power regulator in response to the adjustable power control signal. The independent generation of the biasing signal reduces noise due to, for instance, variations in the output supply voltage required for adjusting the power level of the power amplifier. In addition, variations in the biasing signals due to fluctuations in a battery voltage supplying the power regulator are greatly reduced. In an illustrative implementation, the biasing signal is a linear sum of a reference voltage and the adjustable power control signal.

Yet another aspect of the present invention includes a method for improving performance of power amplifiers comprising the steps of: providing a variable output supply voltage responsive to an adjustable power control signal; providing a bias signal that is generated independent of the generation of the variable output supply voltage and in response to the adjustable power control signal, providing the variable output supply voltage to an amplifier stage; and providing the bias signal to bias the amplifier stage.

An embodiment includes improving low power efficiency of a power amplifier circuit by providing a suitable biasing signal for a lower supply voltage while providing resistance to noise due to, for instance, variations in the battery voltage driving a circuit for providing a variable output voltage. The suitable biasing signal is preferably a linear sum of voltages including at least one adjustable power control voltage and at least one regulated voltage. The generation of the biasing signal is undertaken, preferably without sampling the supply voltage. The power amplifier circuit adjusts the biasing conditions in accordance with the power level.

The linear sum of voltages may further be obtained by constructing a summing amplifier circuit; followed by connecting a voltage source and a regulated voltage to the summing amplifier circuit with, optionally, further connecting an output of said summing amplifier circuit to an input of a FET. The drain voltage of the FET is illustrative of the linear sum of voltages.

In addition, one or more supply voltages may be connected to an input of a variable supply voltage circuit, which is separated from the summing amplifier circuit; and connecting one or more outputs of the variable supply voltage circuit to the power amplifier circuit.

BRIEF DESCRIPTION OF THE DRAWINGS

The invention will be described by reference to the preferred and alternative embodiments thereof in conjunction with the drawings in which.

DETAILED DESCRIPTION

One embodiment of the present invention includes a power amplifier comprising a plurality of amplifier stages, a power regulator and an amplifier biaser. By way of example, this power amplifier may be used in a GSM or PCS mobile device.

Figure 2:
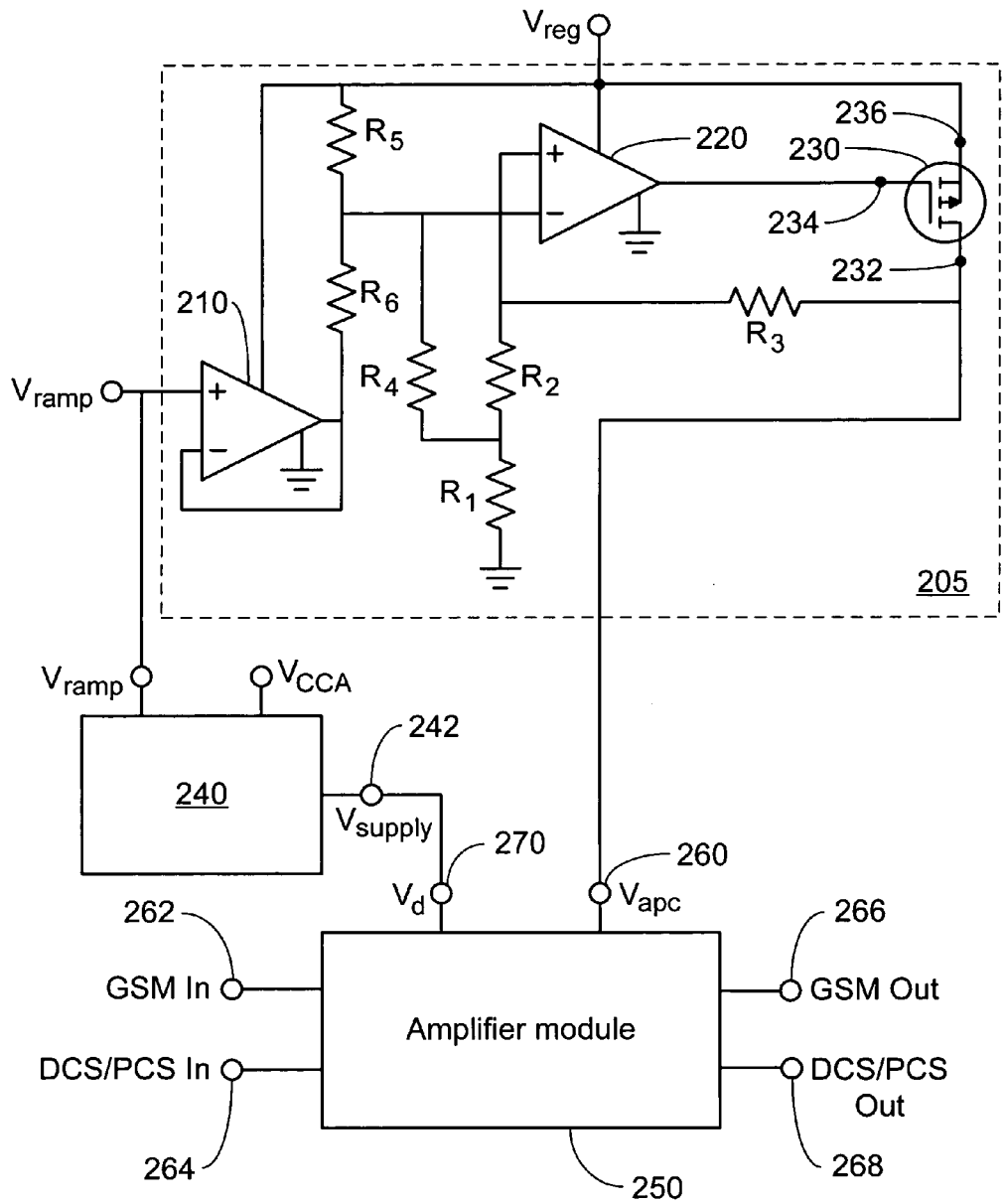
FIG. 2 is a schematic diagram of one embodiment of the present invention.

FIG. 2 is a schematic diagram of an embodiment of the present invention illustrating a power amplifier configuration. In this embodiment, the amplifier module 250 contains one or more power amplifier stages, which are preferably cascaded. The amplifier module 250 may contain one or more input ports 262, 264 for receiving input GSM or PCS signals and one or more output ports 266, 268. In some embodiments, the amplifier module is a three-stage amplifier in a cascade configuration. In some embodiments, each amplifier stage comprises a heterojunction bipolar transistor (HBT). In alternative embodiments, each amplifier stage comprises a field effect transistor (FET). The amplifier module 250 further receives bias voltage, Vapc, via port 260 and power supply voltage, Vd, via port 270 to provide bias and operating power, respectively, for one or more power amplifier stages in amplifier module 250.

Power regulator 240 provides output supply voltage, Vsupply, at output node 242 in response to adjustable power control signal Vramp. Vsupply is used as a power supply voltage for the amplifier module 250 and it is received as power supply voltage Vd of amplifier module 250 at port 270.

Amplifier biaser 205 provides a bias signal to the amplifier module 250 at port 260. The bias signal may be a bias voltage and is responsive to the adjustable power control signal, Vramp. In the embodiment shown in FIG. 2, the output supply voltage, Vsupply, and the bias signal are independently generated as functions of the adjustable power control signal, Vramp.

Bias voltage, Vapc, is generated as a function of a regulated voltage, Vreg, and the adjustable power control voltage signal, Vramp. Vapc is, preferably, a linear function of Vreg and Vramp. The regulated voltage, Vreg, may be an external voltage, or an internally generated regulated voltage that can be adjusted according to Vramp. Vreg provides a lower threshold for the bias voltage.

The amplifier biaser 205 shown in FIG. 2 illustrates an example linear embodiment implemented with an adder circuit comprising two op/amps 210 and 220 connected in series, PMOS transistor 230 and resistors R1-R6 connected between op/amps 210, 220 and PMOS transistor 230. Op/amp 210 and op/amp 220 may use complementary implementations. For example, if op/amp 210 is PMOS-based then op/amp 220 may be NMOS-based and vice versa. This detail, however, is not intended to be a limitation on the scope of the invention and similar or alternative implementations of the op/amp pair may be instantiated by readjustment of the feedbacks to the op/amps. Source 236 of PMOS transistor 230 is coupled to regulated voltage, Vreg. Drain 232 of PMOS transistor 230 is connected to power amplifier module 250 and provides bias voltage, Vapc, to power amplifier module 250. The output of op/amp 220 is coupled to the gate 234 of PMOS transistor 230. The drain of PMOS transistor 230 is used as a feedback signal to the input of op/amp 220 through resistor R3. This feedback structure ensures the stability of Vapc and speeds up the response time of Vapc (in response to changes of Vramp).

Op/Amps 210, 220 and PMOS transistor 230 work together as a linear voltage regulator under the control of Vramp. The linear voltage regulator varies bias voltage, Vapc, according to a linear sum of Vreg and Vramp. In FIG. 2's embodiment, Vapc is approximately $$V_{apc} = k_1 V_{reg} + k_2 V_{ramp}$$

where $$k_1 = \frac{R_5}{R_5 + R_6}\left(\frac{R_3}{R_2 + R_1 \| R_4} + 1\right) - \frac{R_3}{R_4 + R_1 \| R_2}$$

and $$k_2 = \frac{R_6}{R_5 + R_6}\left(\frac{R_3}{R_2 + R_1 \| R_4} + 1\right)$$

and where $R_1 \| R_4$ is the resistance of $R_1$ in parallel with $R_4$.

Figure 3:
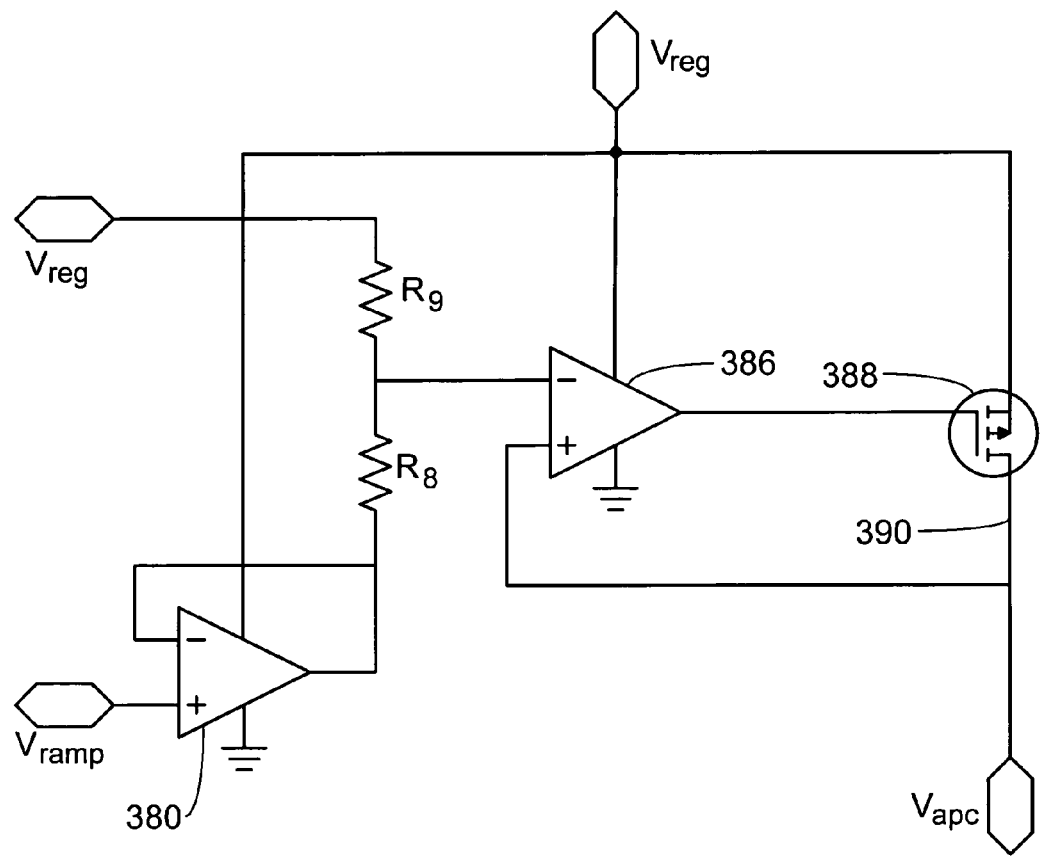
FIG. 3 is a schematic diagram of another embodiment of the present invention.

As is understood by people having ordinary skill in the art, such a linear sum may be realized by a variety of alternative functionally similar circuit configurations. FIG. 3 shows another embodiment of the linear voltage regulator circuit generating a linear sum of Vreg and Vramp. This circuit embodiment includes op/Amps 380 and 386, PMOS 388 and two resistors $R_8$ and $R_9$. The voltage at the drain 390 of PMOS 388 is used as the bias voltage output, Vapc. The bias voltage output of the embodiment shown in FIG. 3 is a linear combination of Vreg and Vramp expressed as $$V_{apc} = kV_{reg} + (1-k)V_{ramp}$$

where k is a combination of $R_8$ and $R_9$.

The output supply voltage, Vsupply, provided by the power regulator 240 in FIG. 2 may also be implemented as a linear function of the adjustable power control signal, Vramp, such that Vsupply is approximately $m*V_{ramp}$ where m is a constant of proportionality. Preferably, a feedback circuit having a large bandwidth ensures that Vsupply tracks changes in Vramp close enough to satisfy the "burst mask" and other stringent requirements for compliance with applicable standards. This linear dependence may be realized using a variety of circuit configurations, such as an op/Amp scale changer and an inverter.

In one embodiment, the power amplifier may further comprise a common biaser to provide the same bias to two or more amplifier stages in the amplifier module 250 of FIG. 2. Moreover, the power regulator and the amplifier biaser may be implemented in a single integrated circuit or in separate circuits. Furthermore, the ranges of the bias voltage, Vapc, and the output supply voltage, Vsupply, depend on the values of $k_1$, $k_2$, m, the operating range of the adjustable power control voltage, Vramp, and the regulator voltage, Vreg. In a preferred embodiment, Vapc is approximately $0.3*V_{reg} + 0.7*V_{ramp}$.

Figure 1:
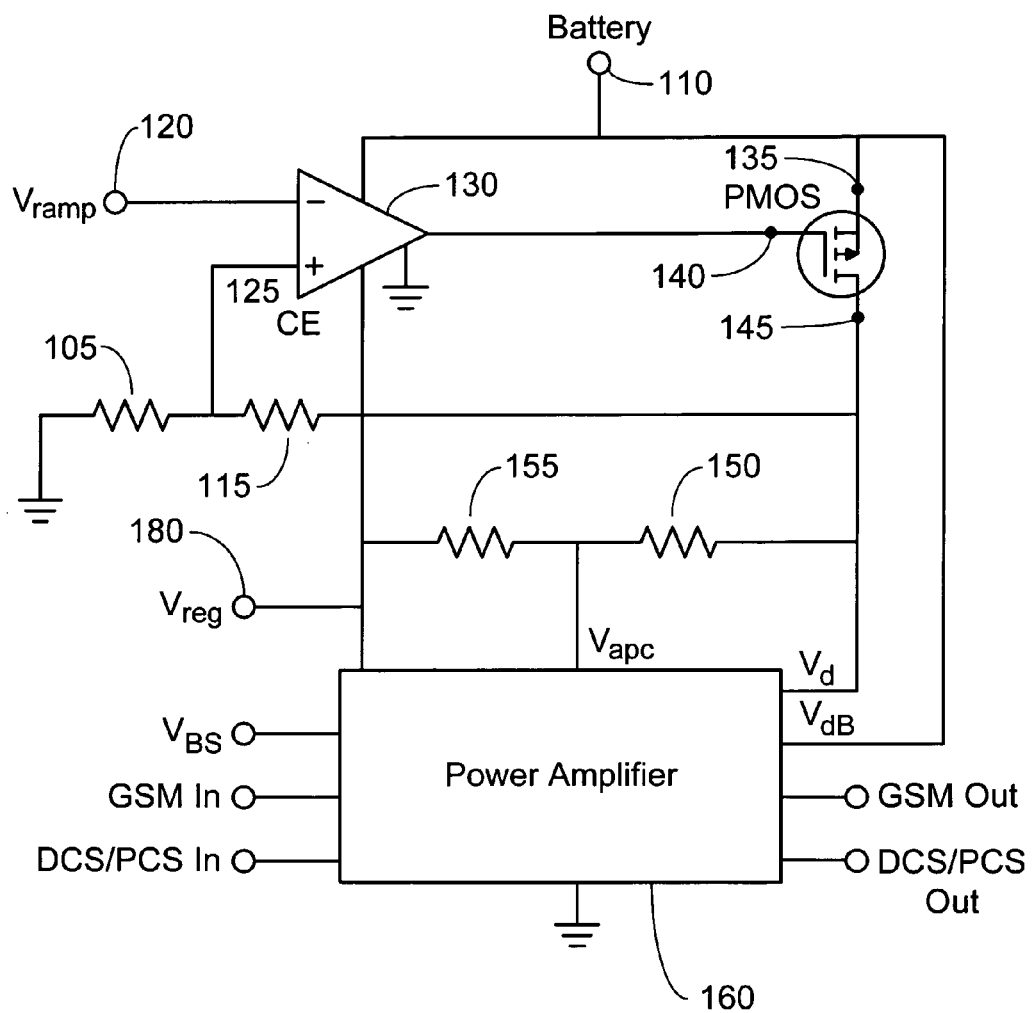
FIG. 1 is a schematic diagram illustrating an RF power amplifier having an adjustable supply voltage.

Unlike prior art design shown in FIG. 1, the embodiments shown in FIGS. 2 and 3 exhibit higher amplifier power efficiency. The higher power amplifier efficiency is a result of a cleaner input signal having less noise than in the prior art systems. A power amplifier amplifies both signal and noise components of the input signal and reducing the noise component in the input signal results in an amplified output signal having a greater portion of the output power in the signal instead of the noise component. In the prior art design, noise enters the amplifier input through the bias voltage, Vapc. As shown in FIG. 1, Vapc is determined by the voltage divider circuit tied to the supply voltage, Vd. Any noise in Vd is passed directly to Vapc and the amplifier input. Vd is a relatively noisy signal that contributes to the input noise. Filters may be used to reduce the noise in the Vd signal but response time constraints placed on Vd severely limit the amount of filtering that may be applied to the signal. The response time constraints on Vd arise from requirements, such as "burst mask," on the amplifier output power that specific the maximum rise and fall time for power levels. In adjustable power amplifiers controlled by the supply voltage, the response time requirements on the output power levels are directly related to the responsiveness of Vd thereby limiting the amount of filtering applied to Vd.

The embodiments shown in FIGS. 2 and 3 prevent noise in Vd from entering the base of the power amplifier through Vapc by tying Vapc to a regulated voltage, Vreg. Unlike Vd, extensive filtering using known methods may be applied to generate a Vreg that has very little noise. The low noise of Vreg is also exhibited in Vapc because Vapc is a linear function of Vramp and Vreg. The low noise of Vapc results in higher power efficiency of the power amplifier because power is not wasted on amplifying input noise.

In another embodiment, each amplifier stage in the power amplifier is provided a bias voltage Vapc generated using circuit module 205. Each bias voltage is adjusted such that each amplifier stage operates at its saturation region. This ensures that both current consumption and noise suppression are optimized, especially at lower power.

Figure 4:
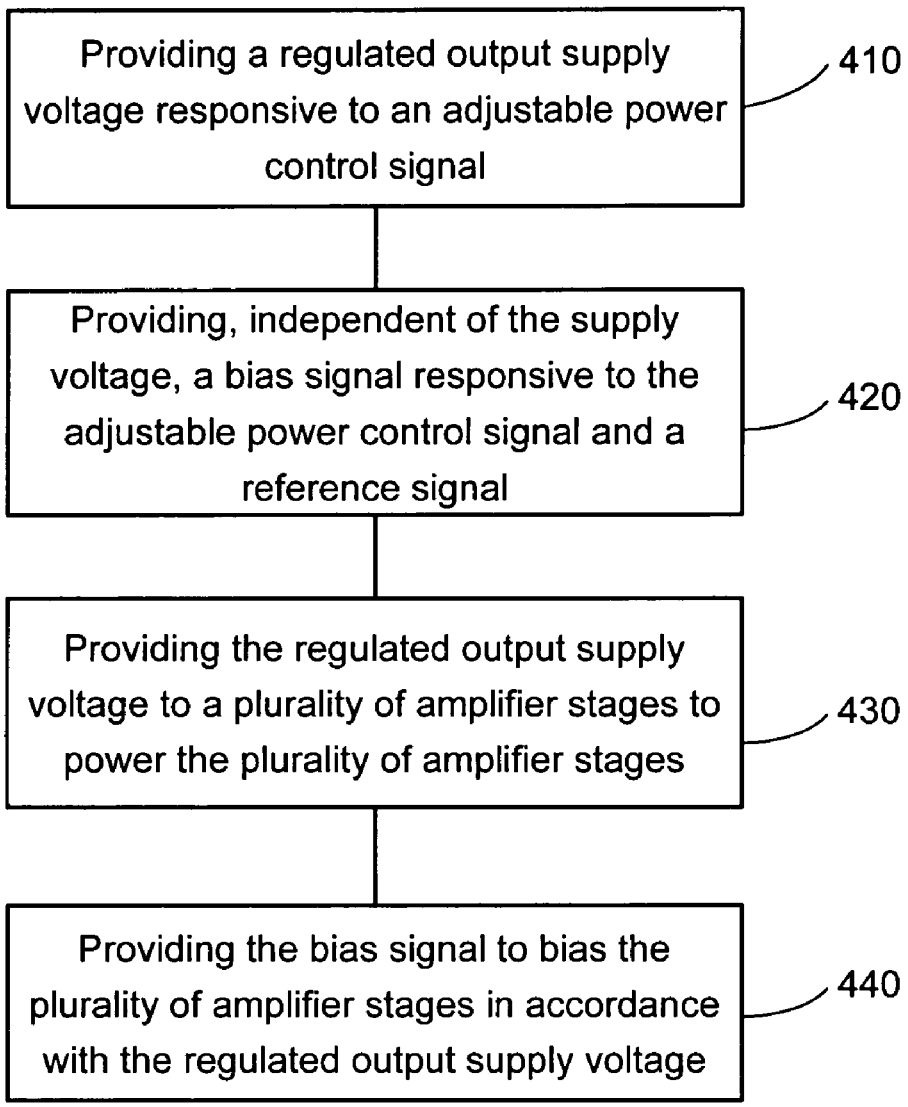
FIG. 4 is a flow diagram illustrating another embodiment of the present invention.

Another embodiment of the present invention comprises a method as described in the flow chart shown in FIG. 4. Step 410 of the method provides a regulated output supply voltage responsive to an adjustable power control signal, such as Vramp in FIG. 2. The output supply voltage may be any function of the adjustable power control signal. In some embodiments, the regulated output supply voltage Vsupply is generated using a power regulator module such as module 240 in FIG. 2. Step 420 provides a bias signal, such as Vapc, responsive to the adjustable power control signal and a reference signal, such as Vreg. The bias signal may be generated as a function of the adjustable power control signal and the reference signal. In some embodiments, the bias signal is generated as a linear sum of the adjustable power control signal and the reference signal through op/amp summing circuit configurations such as those shown in FIG. 2 or FIG. 3. Step 430 of the method couples the regulated output supply voltage to a plurality of amplifier stages to provide operating power to the plurality of amplifier stages. Step 440 provides the bias signal to bias the plurality of amplifier stages in accordance with the regulated output supply voltage.

Yet another embodiment of the present invention comprises a system for improving low power efficiency of a power amplifier circuit. The power amplifier circuit usually has one or more supply voltage inputs, such as Vd in FIG. 3, connected to one or more supply voltage sources, such as Vsupply, one or more power control voltage inputs, such as Vapc, and one or more regulated voltage inputs, such as Vreg. A typical power amplifier circuit is the MMM 5062 amplifier as described in the background section.

As shown in FIG. 2, the system for improving low power efficiency of a power amplifier circuit comprises a circuit for obtaining a linear sum of voltages including one or more adjustable voltage inputs, such as Vramp, and one or more regulated voltage sources, such as Vreg, without sampling one or more supply voltage sources; and wherein the linear sum of voltages is used as at least one power control voltage input, such as Vapc, of the power amplifier circuit.

The above system may further comprise a second summing amplifier circuit separated from the first summing amplifier circuit. As shown FIG. 2, the second summing circuit is formed by power regulator module 240. Module 240 receives the control voltage Vramp as input and generates a supply voltage, Vsupply, corresponding to the supply voltage input, Vd, for the power amplifier circuit 250. As described above, the module 240 maintains a linear relationship between Vsupply and Vramp. This ensures that changes in Vramp are tracked closely by Vsupply so that the "burst mask" requirements are satisfied when the power amplifier circuit 250 is used in a GSM or PCS radio.

Module 240 may further comprise a closed feedback loop to compensate the fluctuations in Vsupply caused by temperature, battery voltage, or other variations. The closed feedback loop may further comprise a bandgap voltage reference that is stable over all external parameter variations. This bandgap voltage reference compensates for the variations in Vsupply and therefore ensures that Vsupply, and any voltages derived from Vsupply, are also stable over external variations.

It will be appreciated that the present invention is not limited to only the embodiments specifically described herein. While the foregoing description and drawings represent certain embodiments of the present invention, it will be understood that various additions, modifications, and substitutions may be made therein without departing from the spirit and scope of the present invention as defined in the accompanying claims. In particular, it will be clear to those skilled in the art that the present invention may be embodied in other specific forms, structures, and arrangements, and with other elements, and components, without departing from the spirit or essential characteristics thereof. One having ordinary skill in the art will appreciate that the invention may be used with many modifications of structure, arrangement, and components and otherwise, used in the practice of the invention, which are particularly adapted to specific environments and operative requirements without departing from the principles of the present invention. The presently disclosed embodiment is therefore to be considered in all respects as illustrative and not restrictive. The invention is limited only as defined in the following claims and the equivalents thereto.

What is claimed is:

1. A power amplifier comprising:
a plurality of amplifier stages,
a power regulator providing an output supply voltage at an output node responsive to an adjustable power control signal, wherein the output supply voltage is applied to at least one stage of the power amplifier; and
an amplifier biaser providing a bias signal corresponding to the adjustable power control signal,
wherein the output supply voltage and the bias signal are independently generated, the output supply voltage as a function of the adjustable power control signal and the bias signal as a function of a regulated voltage and the adjustable power control signal.

2. The power amplifier of claim 1, wherein the bias signal is a linear function of a regulated voltage and the adjustable power control signal.

3. The power amplifier of claim 1 wherein the bias signal is applied to two or more amplifier stages.

4. The power amplifier of claim 1 wherein the bias signal is a linear sum of the regulated voltage and the adjustable power control signal.

5. The power amplifier of claim 2 wherein the power regulator and the amplifier biaser are implemented in a single integrated circuit.

6. The power amplifier of claim 1 wherein the output supply voltage provided by the power regulator is a linear function of the adjustable power control signal.

7. A power amplifier comprising:
a plurality of amplifier stages,
a power regulator providing an output supply voltage at an output node responsive to an adjustable power control signal, wherein the output supply voltage is applied to at least one stage of the power amplifier; and
an amplifier biaser providing a bias signal corresponding to the adjustable power control signal,
wherein the output supply voltage and the bias signal are independently generated, the bias signal, $V_{apc}$, is given by $V_{apc}=kV_{reg}+(1-k)V_{ramp}$ and the output supply voltage is proportional to Vramp where Vreg is the regulated voltage, Vramp is the adjustable power control signal and k is a constant.

8. A mobile terminal comprising the power amplifier of claim 1.

9. A semiconductor implementing the power amplifier of claim 1.

10. A power amplifier comprising a power regulator and an amplifier biaser, wherein the power regulator and the amplifier biaser are independently responsive to an adjustable power control signal such that the amplifier biaser generates a bias signal corresponding to an output supply voltage provided by the power regulator in response to the adjustable power control signal to reduce noise generated by a change in the output supply voltage and the bias signal is a linear sum of a regulated voltage and the adjustable power control signal and the output supply voltage is a linear function of the adjustable power control signal.

11. A power amplifier comprising a power regulator and an amplifier biaser, wherein the power regulator and the amplifier biaser are independently responsive to an adjustable power control signal such that the amplifier biaser generates a bias signal corresponding to an output supply voltage provided by the power regulator in response to the adjustable power control signal to reduce noise generated by a change in the output supply voltage and the bias signal, Vapc, is given by $V_{apc}=kV_{reg}+(1-k)V_{ramp}$ and the output supply voltage is proportional to Vramp where Vreg is a regulated voltage, Vramp is the adjustable power control signal and k is a constant.

12. A method comprising the steps of:
   (a) providing a variable output supply voltage responsive to an adjustable power control signal;
   (b) providing a bias signal independently responsive to the adjustable power control signal and a regulated voltage signal;
   (c) providing the variable output supply voltage to a plurality of amplifier stages to power the plurality of amplifier stages; and
   (d) providing the bias signal to bias the plurality of amplifier stages in accordance with the adjustable power control signal.

13. The method of claim 12 further comprising providing the bias signal and the output supply voltage to at least one input amplifier stage in the plurality of amplifier stages.

14. The method of claim 12 further comprising providing the bias signal and the output supply voltage to at least one input amplifier stage and at least one power amplifier stage in the plurality of amplifier stages.

15. A method for improving low power efficiency of a power amplifier, the power amplifier having one or more supply voltage inputs connected to one or more supply voltage sources, at least one adjustable power control voltage input and at least one regulated voltage input, the method comprising the steps of:
   obtaining a linear sum of voltages including one or more adjustable power control voltage inputs and one or more regulated voltage sources without sampling the one or more supply voltage sources; and
   using said linear sum of voltages as at least one power control voltage input of the power amplifier.

16. The method of claim 15, wherein the step of obtaining further comprises the steps of:
   providing a first summing amplifier circuit; and
   connecting one or more supply voltage sources and regulated voltage inputs to the input of the first summing amplifier circuit.

17. The method of claim 16, wherein the step of obtaining further comprises the steps of:
   connecting one output of said first summing amplifier circuit to a control input of a FET; and
   using the drain voltage of said FET as at least part of the linear sum of voltages.

18. The method of claim 15, wherein the power amplifier circuit is a power amplifier circuit for handheld radios.

19. The method of claim 18, wherein the power amplifier circuit is a power amplifier circuit for GSM handheld mobile device.

20. A method for improving low power efficiency of a power amplifier, the power amplifier having one or more supply voltage inputs connected to one or more supply voltage sources, at least one adjustable power control voltage input and at least one regulated voltage input, the method comprising the steps of:
   obtaining a linear sum of voltages including one or more adjustable power control voltage inputs and one or more regulated voltage sources without sampling the one or more supply voltage sources;
   using said linear sum of voltages as at least one power control voltage input of the power amplifier,
   providing a first summing amplifier circuit;
   connecting one or more supply voltage sources and regulated voltage inputs to the input of the first summing amplifier circuit;
   connecting one or more supply voltage sources to the inputs of a second summing amplifier circuit, said second summing amplifier circuit being separated from the first summing amplifier circuit; and
   connecting one or more outputs of the second summing amplifier circuit to one or more supply voltage inputs of the power amplifier circuit.

21. A system for improving low power efficiency of a power amplifier, the power amplifier having one or more supply voltage inputs connected to one or more supply voltage sources, one or more power control voltage inputs and one or more regulated voltage inputs, the system further comprising:
   a circuit for obtaining a linear sum of voltages including one or more adjustable voltage inputs and one or more regulated voltage sources without sampling one or more supply voltage sources;
   wherein said linear sum of voltages is used as at least one power control voltage input of the power amplifier.

22. The system of claim 21, wherein the circuit for obtaining a linear sum of voltages further comprises a first summing amplifier circuit; wherein one or more supply voltage sources and regulated voltage inputs are connected to the input of said first summing amplifier circuit.

23. The system of claim 22, wherein one output of said first summing amplifier circuit is connected to a control input of a FET and the drain voltage of said FET is used as at least part of the linear sum of voltages.

24. The system of claim 21, further comprising a second summing amplifier circuit being separated from the first summing amplifier circuit, wherein one or more supply voltage sources are connected to the inputs of said second summing amplifier circuit and one or more outputs of the second summing amplifier circuit are connected to one or more supply voltage inputs of the power amplifier circuit.

25. The system of claim 21, wherein the power amplifier circuit is a power amplifier circuit for handheld radios.

26. The system of claim 25, wherein the power amplifier circuit is a power amplifier circuit for GSM handheld radios.

* * * * *